United States Patent
Lim et al.

(10) Patent No.: US 9,299,750 B2
(45) Date of Patent: Mar. 29, 2016

(54) ORGANIC LIGHT EMITTING DIODE DISPLAY DEVICE INCLUDING TOUCH PANEL

(71) Applicant: LG DISPLAY CO., LTD., Seoul (KR)

(72) Inventors: Kwang-Su Lim, Paju-si (KR); Joon-Won Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 356 days.

(21) Appl. No.: 13/872,639

(22) Filed: Apr. 29, 2013

(65) Prior Publication Data
US 2014/0184937 A1    Jul. 3, 2014

(30) Foreign Application Priority Data
Dec. 27, 2012    (KR) .................. 10-2012-0155005

(51) Int. Cl.
*H01L 27/32*    (2006.01)
*G06F 3/041*    (2006.01)
*G06F 3/044*    (2006.01)
*G09G 3/32*    (2006.01)
*G02F 1/1333*    (2006.01)

(52) U.S. Cl.
CPC .............. *H01L 27/323* (2013.01); *G06F 3/044* (2013.01); *G06F 3/0412* (2013.01); *G02F 1/13338* (2013.01); *G02F 2001/133357* (2013.01); *G09G 3/3266* (2013.01); *H01L 2224/83851* (2013.01)

(58) Field of Classification Search
CPC .......... G02F 1/13338; G02F 1/133345; G02F 2001/133357; G06F 3/0412; G06F 3/044; G09G 3/3266; H01L 27/323; H01L 27/3276; H01L 27/3297; H01L 2224/83851
See application file for complete search history.

(56) References Cited

U.S. PATENT DOCUMENTS

| | | | |
|---|---|---|---|
| 7,038,377 B2* | 5/2006 | Kobayashi et al. | ........... 313/512 |
| 2002/0000979 A1* | 1/2002 | Furuhashi et al. | ........... 345/173 |
| 2006/0244741 A1 | 11/2006 | Kimura et al. | |
| 2011/0074729 A1* | 3/2011 | Im et al. | ........ 345/174 |
| 2011/0128240 A1* | 6/2011 | Choi | ............ 345/173 |
| 2011/0205716 A1 | 8/2011 | Moriwaki | |
| 2011/0316802 A1 | 12/2011 | Choi | |
| 2012/0105344 A1 | 5/2012 | Ko et al. | |

FOREIGN PATENT DOCUMENTS

| | | |
|---|---|---|
| CN | 102081247 A | 6/2011 |
| CN | 102203840 A | 9/2011 |
| CN | 102231013 A | 11/2011 |
| CN | 102299166 A | 12/2011 |
| CN | 102467289 A | 5/2012 |
| JP | 2003-272521 A | 9/2003 |

* cited by examiner

Primary Examiner — Paisley L Arendt
(74) Attorney, Agent, or Firm — Birch, Stewart, Kolasch & Birch, LLP

(57) ABSTRACT

An organic light emitting diode (OLED) display device having a built-in touch panel is discussed in which pad parts of a touch panel array are connected on a gate in panel (GIP) circuit unit formed on a lower substrate with an OLED array formed thereon. When an upper substrate is adhered to the lower substrate, occurrence of cracks in routing lines of the touch panel array is prevented. The OLED display device includes a lower substrate provided thereon with an organic light emitting diode array including a thin film transistor and an OLED and a GIP circuit unit, an upper substrate adhered to the lower substrate by an adhesive layer to face each other and provided thereon with a touch panel array including first and second sensor electrodes, and routing lines formed on the GIP circuit unit to be connected to the first and second sensor electrodes.

12 Claims, 4 Drawing Sheets

ORGANIC LIGHT EMITTING DIODE DISPLAY DEVICE INCLUDING TOUCH PANEL

This application claims the benefit of Korean Patent Application No. 10-2012-0155005, filed on Dec. 27, 2012, which is hereby incorporated by reference as if fully set forth herein.

BACKGROUND OF THE INVENTION

1. Field of the Invention

The present invention relates to an organic light emitting diode display device having a built-in touch panel, and more particularly, to an organic light emitting diode display device having a built-in touch panel in which a bad connection between a touch panel and an OLED array may be prevented by preventing disconnection of routing lines.

2. Discussion of the Related Art

Recently, organic light emitting diode (OLED) display devices have received attention as next generation display devices. An OLED is a self emitting device in which light is emitted from an organic emission layer due to recombination of electrons and holes, has high brightness and a low driving voltage, and enables fabrication of a super slim device. Requirements for addition of a touch panel to the OLED display device are increasing to transmit information to the OLED display device by touching a portion of the touch panel with a hand or separate input members.

General touch panels are classified into three types: an Add-On type, an On-Cell type, and an In-Cell type. The Add-On type touch panel is attached to an outer surface of the OLED display device, the On-Cell type touch panel is deposited on the OLED display device, and the In-Cell type touch panel is installed inside the OLED display device.

Since the In-Cell type touch panel is built in an OLED display device, the thickness of the OLED display device having the built-in In-Cell type touch panel is smaller than that of an OLED display device having a built-in Add-On type or On-Cell type touch panel.

In general, an OLED display device having a built-in touch panel includes a lower substrate on which an OLED array is formed and an upper substrate on which a touch panel array is formed. The lower and upper substrates are adhered to each other by an adhesive layer to face each other. The touch panel array includes sensor electrodes formed on the upper substrate, and the sensor electrodes are connected to upper pad electrodes via routing lines.

The upper pad electrode is connected to a lower pad electrode formed on the lower substrate via a conductive metal material. The lower pad electrode is connected to a flexible printed circuit board (FPCB) and thus a driving signal of the FPCB is applied to the sensor electrode through the lower pad electrode, the conductive metal material, and the upper pad electrode.

Meanwhile, when the routing lines overlap an edge of the adhesive layer in a horizontal direction when the upper substrate is adhered to the lower substrate, cracks are generated in the routing lines due to a step between a region in which the adhesive layer is formed and a region in which the adhesive layer is not formed. Moreover, a general OLED display device having a built-in touch panel requires a space for connecting the upper and lower pad electrodes. Accordingly, a bezel region increases and thus a display region decreases.

SUMMARY OF THE INVENTION

Accordingly, the present invention is directed to an organic light emitting diode display device including a touch panel that substantially obviates one or more problems due to limitations and disadvantages of the related art.

An object of the present invention is to provide an organic light emitting diode (OLED) display device having a built-in touch panel in which pad parts of a touch panel array are connected on a gate in panel (GIP) circuit unit formed on a lower substrate with an OLED array formed thereon and thus, when an upper substrate is adhered to the lower substrate, occurrence of cracks in routing lines may be prevented.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device having a built-in touch panel includes a lower substrate provided thereon with an organic light emitting diode array including a thin film transistor and an organic light emitting diode and an gate in panel (GIP) circuit unit, an upper substrate adhered to the lower substrate by an adhesive layer to face each other and including a touch panel array including first and second sensor electrodes and first routing lines each having a first end connected to the first and second sensor electrodes and a second end connected to a pad part, and a second routing line formed on the GIP circuit unit to be connected to the pad part via a conductive metal material.

The first routing lines may vertically overlap an edge of the adhesive layer.

Grooves may be formed at an inner side of the adhesive layer in regions of the edge of the adhesive layer with which the first routing lines overlap.

The organic light emitting diode includes a first electrode connected to the thin film transistor, an organic emission layer formed on the first electrode, and a second electrode formed on the organic emission layer.

The second routing line may be formed on the same layer level as the first electrode.

The second routing line may be formed on the same layer level as the second electrode.

The touch panel array may include bridge electrodes formed on the upper substrate, an insulating layer formed to cover the bridge electrodes, first sensor electrodes formed on the insulating layer and electrically connected to the bridge electrodes exposed by selectively removing the insulating layer, and second sensor electrodes formed on the insulating layer to cross the first sensor electrodes.

The pad part and the second routing line may be connected to each other via a conductive metal material.

The conductive metal material may be an anisotropic conductive paste or an anisotropic conductive film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of an organic light emitting diode (OLED) display device having a built-in touch panel will be described in detail with reference to the accompanying drawings.

Figure 1:
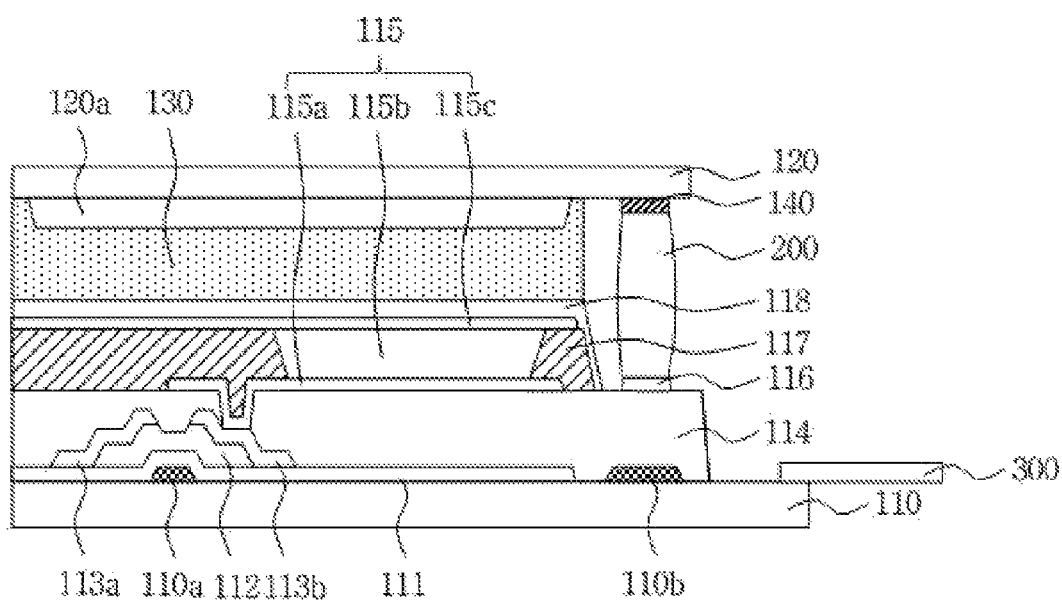
FIG. 1 is a sectional view of an organic light emitting diode (OLED) display device having a built-in touch panel, according to an embodiment of the present invention.

FIG. 1 is a sectional view of an OLED display device having a built-in touch panel, according to an embodiment of the present invention.

In the OLED display device having a built-in touch panel, as illustrated in FIG. 1, a lower substrate 110 on which an OLED array is formed and an upper substrate 120 on which a touch panel array 120a is formed are adhered to each other by an adhesive layer 130 to face each other. In this regard, a flexible printed circuit board (FPCB) 300 for driving the touch panel array 120a is formed on the lower substrate 110, and the FPCB 300 further includes a timing controller, a power supply, and the like to drive the OLED array.

In particular, in a display region of the lower substrate 100, a plurality of gate lines and a plurality of data lines cross each other to define a plurality of pixel regions. In each pixel region, the OLED array including a thin film transistor (TFT) and an OLED 115 connected to the TFT is formed.

The TFT includes a gate electrode 110a, a gate insulating layer 111, a semiconductor layer 112, a source electrode 113a, and a drain electrode 113b. In this regard, the TFT may be an oxide TFT including the semiconductor layer 112 formed of an oxide such as indium gallium zinc oxide (IGZO), zinc oxide (ZnO), titanium oxide (TiO), or the like, an organic TFT including the semiconductor layer 112 formed of an organic material, an amorphous silicon TFT including the semiconductor layer 112 formed of amorphous silicon, and a polycrystalline silicon TFT including the semiconductor layer 112 formed of polycrystalline silicon.

In FIG. 1, a bottom gate type TFT is illustrated, but a top gate type TFT may also be used.

In a non-display region of the lower substrate 110, a gate driver for applying an electrical signal to the gate lines is formed in a gate-in-panel (GIP) form. A GIP circuit unit 110b is disposed at one side or opposite sides of the display region.

A planarizing layer 114 is formed to cover the TFT and the GIP circuit unit 110b to planarize upper surfaces of the TFT and the GIP circuit unit 110B. The OLED 115 is formed on the planarizing layer 114. The OLED 115 includes a first electrode 115a, an organic emission layer (EML) 115b, and a second electrode 115c which are sequentially stacked, and each of the adjacent OLEDs 115 is defined by a bank insulating layer 117.

In this regard, the OLED 115 may be a bottom emission type OLED that emits light emitted from the organic EML 115b towards the lower substrate 110 or a top emission type OLED that emits light emitted from the organic EML 115b towards the upper substrate 120. For example, when the OLED 115 is of a bottom emission type, the first electrode 115a is formed of a transparent conductive material such as tin oxide (TO), indium tin oxide (ITO), indium zinc oxide (IZO), or indium tin zinc oxide (ITZO), and the second electrode 115c is formed of a reflective metal material such as aluminum (Al). On the other hand, when the OLED 115 is of a top emission type, the first electrode 115a is formed of a reflective metal material, and the second electrode 115c is formed of a transparent conductive material.

In particular, second routing lines 116 formed of the same material as that of the first electrode 115a of the OLED 115 are formed on the planarizing layer 114 to correspond to the GIP circuit unit 110b formed on the lower substrate 110. Although not shown, the second routing lines 116 are connected to the FPCB 300.

In addition, a protective layer 118 is formed to cover the OLED 115. The protective layer 118 is formed of an inorganic insulator such as $SiO_x$, $SiN_x$, SiC, SiON, SiOC, SiONC, or amorphous carbon (a-C) or an organic insulator such as acrylate, an epoxy-based polymer, or an imide-based polymer. The lower substrate 110 including the protective layer 118 and the upper substrate 120 are adhered to each other by the adhesive layer 130 to face each other.

The touch panel array 120a is formed on the upper substrate 120 to sense changes in capacitance generated when the human body or an electric conductor such as a stylus touches the upper substrate 120 and thus the OLED array is driven in response to the changes.

Figure 2A:
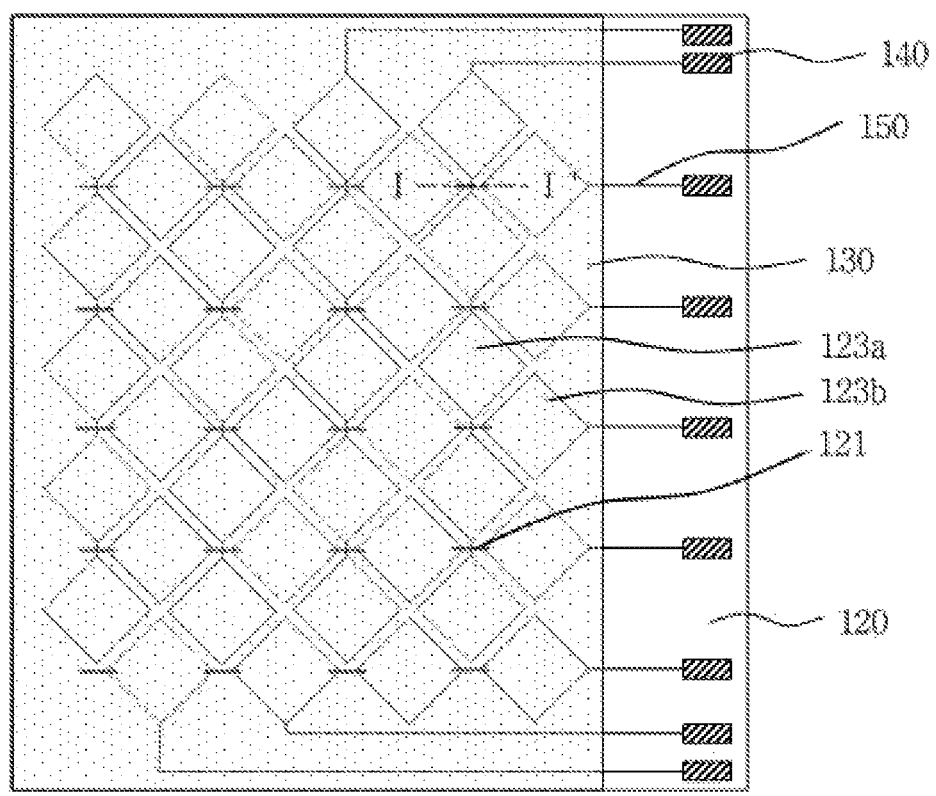
FIGS. 2A and 2B are plan views of an upper substrate on which a touch panel array is formed, according to embodiments of the present invention.
Figure 2B:
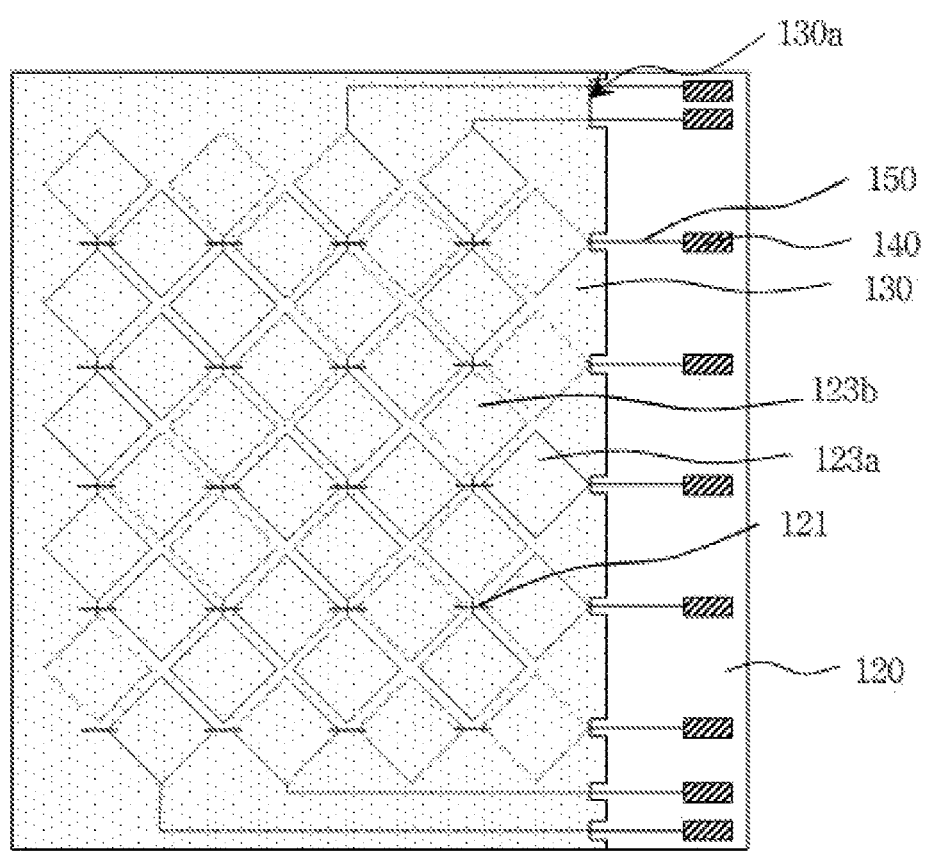
Figure 3:
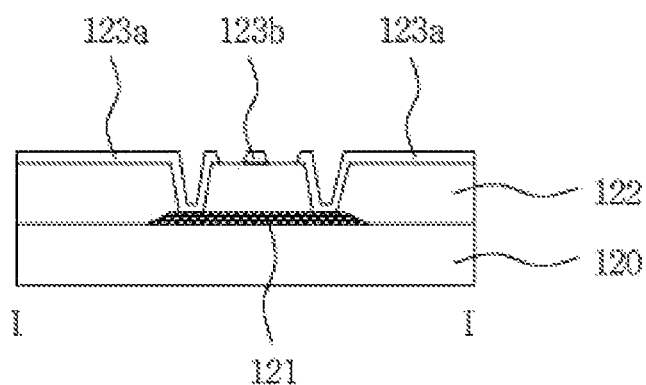
FIG. 3 is a sectional view taken along line I-I' of FIG. 2A.

FIGS. 2A and 2B are plan views of the upper substrate 120 on which a touch panel array is formed, according to embodiments of the present invention. FIG. 3 is a sectional view taken along line I-I' of FIG. 2A.

As illustrated in FIGS. 2A, 2B, and 3, the touch panel array includes bridge electrodes 121 formed on the upper substrate 120, first sensor electrodes 123a that are formed on the insulating layer 122 and connected to exposed portions of the bridge electrodes 121 which are formed by selectively removing the insulating layer 122, and second sensor electrodes 123b formed between adjacent first sensor electrodes 123a to cross the first sensor electrodes 123a. The first sensor electrodes 123a and the second sensor electrodes 123b are connected to first routing lines 150.

In particular, a plurality of bridge electrodes 121 is formed on the upper substrate 120 in one direction to electrically connect adjacent first sensor electrodes 123a to each other. The bridge electrodes 121 and the first and second sensor electrodes 123a and 123b are formed of a transparent conductive material such as ITO, IZO, or ITZO. The insulating layer 122 is formed of a transparent organic material.

The first routing lines 150 are formed of a low-resistance metal material, and an end of each of the first routing lines 150 is connected to a pad part 140. The pad part 140 is formed to transmit a driving signal of the FPCB 300 of the lower substrate 110 to the first and second sensor electrodes 123a and 123b.

In particular, the pad part 140 is formed to correspond to one end of each of the second routing lines 116 on the lower substrate 110, and, more particularly, the pad part 140 is formed in a region corresponding to the GIP circuit unit 110b. The pad part 140 is respectively connected to the second routing lines 116 of FIG. 1 through respective conductive metal material 200. In this regard, the conductive metal material 200 may be, for example, an anisotropic conductive paste (ACP) or an anisotropic conductive film (ACF).

In particular, in a general OLED display device having a built-in touch panel, a sensor electrode of a touch panel array is connected to an upper pad electrode via a routing line. In addition, a lower pad electrode is formed on a lower substrate to correspond to the upper pad electrode and thus the upper and lower pad electrodes are connected to each other through a conductive metal material.

In this case, when the routing line overlaps an edge of an adhesive layer in a horizontal direction when upper and lower substrates are adhered to each other, cracks are formed in the routing line due to a step between a region in which the adhesive layer is formed and a region in which the adhesive layer is not formed. Moreover, the general OLED display device having a built-in touch panel requires a space for connecting the upper and lower pad electrodes to each other. Accordingly, a bezel region increases and a display region decreases.

By contrast, according to the present invention, the OLED display device having a built-in touch panel does not require an additional space for connecting upper and lower pad electrodes to each other, and the second routing lines 116 are formed in a region corresponding to the GIP circuit unit 110b formed on the lower substrate 110. The second routing lines 116 are respectively connected to the pad part 140 formed on the upper substrate 120.

The second routing lines 116 are formed on the planarizing layer 114 that is formed on the lower substrate 110 to cover the TFT and the GIP circuit unit 110b, like the first electrode 115a of the OLED 115. In addition, although not shown, the second routing lines 116 may be formed of the same material as that of the second electrode 115c of the OLED 115. In this regard, the second routing lines 116 may be formed on the planarizing layer 114 or the bank insulating layer 117.

In particular, the first routing lines 150 formed on the upper substrate 120 vertically overlap an edge of the adhesive layer 130, and thus formation of cracks in the first routing lines 150 at the edge of the adhesive layer 130 when the upper and lower substrates 120 and 110 are adhered may be prevented.

Moreover, as illustrated in FIG. 2B, grooves 130a are formed at an inner side of the adhesive layer 130 in regions of the edge of the adhesive layer 130 with which the first routing lines 150 overlap. Each groove 130a is formed to correspond to at least one of the first routing lines 150. That is, the first routing lines 150 are inserted into the grooves 130a, and thus, when the upper and lower substrates 120 and 110 are adhered to each other by the adhesive layer 130 disposed therebetween, formation of cracks in the first routing lines 150 due to a step of the adhesive layer 130 may be prevented.

In particular, when the lower and upper substrates 110 and 120 are substrates made of a plastic such as polyimide (PI), the OLED display device having a built-in touch panel may have flexibility.

As is apparent from the above description, an OLED display device having a built-in touch panel has the following effects.

First, in a general OLED display device having a built-in touch panel, when routing lines horizontally overlap an edge of an adhesive layer, cracks are formed in the routing lines due to a step between a region in which the adhesive layer is formed and a region in which the adhesive layer is not formed. In an OLED display device having a built-in touch panel according to the present invention, however, first routing lines formed on an upper substrate vertically overlap an edge of an adhesive layer and, in particular, grooves are formed in regions of the edge of the adhesive layer with which the first routing lines overlap. Thus, even though the first routing lines and the adhesive layer overlap each other, formation of cracks in the first routing lines may be prevented.

Second, second routing lines are formed in a region corresponding to a GIP circuit unit formed on a lower substrate, and the second routing lines are respectively connected to pad parts formed on an upper substrate, thereby increasing a display region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode display device having a built-in touch panel, comprising:
   a lower substrate provided thereon with an organic light emitting diode array comprising a thin film transistor (TFT) and an organic light emitting diode and a gate in panel (GIP) circuit unit;
   an upper substrate adhered to the lower substrate by an adhesive layer to face each other and comprising a touch panel array comprising first and second sensor electrodes and first routing lines each having a first end connected to the first and second sensor electrodes and a second end connected to a pad part, the adhesive layer being interposed between the touch panel array and the organic light emitting diode; and
   a second routing line formed on a planarization layer to be connected to the pad part via a conductive metal material, wherein the planarization layer is disposed on the lower substrate to cover the TFT and the GIP circuit unit.

2. The organic light emitting diode display device according to claim 1, wherein the organic light emitting diode comprises:
   a first electrode connected to the thin film transistor;
   an organic emission layer formed on the first electrode; and
   a second electrode formed on the organic emission layer.

3. The organic light emitting diode display device according to claim 2, wherein the second routing line is formed on a same layer level as the first electrode.

4. The organic light emitting diode display device according to claim 2, wherein the second routing line is formed on a same layer level as the second electrode.

5. The organic light emitting diode display device according to claim 2, wherein the second routing line is formed of a same material as that of the first electrode of the organic light emitting diode.

6. The organic light emitting diode display device according to claim 2, wherein the second routing line is formed of a same material as that of the second electrode of the organic light emitting diode.

7. The organic light emitting diode display device according to claim 1, wherein the first routing lines vertically overlap an edge of the adhesive layer.

8. The organic light emitting diode display device according to claim 1, wherein grooves are formed at an inner side of the adhesive layer in regions of an edge of the adhesive layer with which the first routing lines overlap.

9. The organic light emitting diode display device according to claim 1, wherein the touch panel array comprises:
   bridge electrodes formed on the upper substrate;
   an insulating layer formed to cover the bridge electrodes;
   first sensor electrodes formed on the insulating layer and electrically connected to the bridge electrodes exposed by selectively removing the insulating layer; and second sensor electrodes formed on the insulating layer to cross the first sensor electrodes.

10. The organic light emitting diode display device according to claim 1, wherein the pad part and the second routing line are connected to each other via the conductive metal material including an anisotropic conductive paste (ACP).

11. The organic light emitting diode display device according to claim 1, wherein the conductive metal material is an anisotropic conductive paste or an anisotropic conductive film.

12. The organic light emitting diode display device according to claim 1, wherein the pad part and the second routing line are connected to each other via the conductive metal material including an anisotropic conductive film (ACF).

* * * * *